US005785756A

United States Patent [19]

Lee

[11] Patent Number: 5,785,756
[45] Date of Patent: Jul. 28, 1998

[54] PROCESS FOR FABRICATING STRUCTURALLY ROBUST OPTICAL COATINGS

[75] Inventor: Myung B. Lee, West Orange, N.J.

[73] Assignee: Northrop Grumman Corporation, Los Angeles, Calif.

[21] Appl. No.: 811,755

[22] Filed: Mar. 6, 1997

[51] Int. Cl.$^6$ ................................................. C30B 23/04
[52] U.S. Cl. ........................... 117/105; 117/106; 117/108; 117/936; 117/940
[58] Field of Search .................................. 117/105, 106, 117/108, 936, 940

[56] References Cited

U.S. PATENT DOCUMENTS

| | | | |
|---|---|---|---|
| 4,786,616 | 11/1988 | Awal et al. | 437/105 |
| 4,870,032 | 9/1989 | Johnston, Jr. et al. | 117/940 |
| 5,100,832 | 3/1992 | Kitagawa et al. | 437/106 |
| 5,141,894 | 8/1992 | Bisaro et al. | 437/132 |
| 5,164,359 | 11/1992 | Calviello et al. | 505/1 |
| 5,173,443 | 12/1992 | Biricik et al. | 437/181 |
| 5,229,332 | 7/1993 | Cho | 117/940 |
| 5,356,831 | 10/1994 | Calviello et al. | 437/110 |
| 5,387,459 | 2/1995 | Hung | 428/209 |
| 5,458,084 | 10/1995 | Thorne et al. | 117/84 |

OTHER PUBLICATIONS

Schowalter, et al, "Molecular Beam Epitaxy Growth and Applications of epitaxial Fluoride Films", J. Vac. Sci. Technol. A 4(3) pp. 1026–1032, May/Jun. 1986.

Fathauer et al, "Heteroepitaxy of Semiconductor on–insulator Structures: Si and Ge on $CaF_2/Si(III)$"., J. Appl. Phys. 60(11) pp. 3886–3892, Dec. 1, 1986.

Primary Examiner—Robert Kunemund
Attorney, Agent, or Firm—Terry J. Anderson; Karl J. Hoch, Jr.

[57] ABSTRACT

A novel molecular beam epitaxy deposition process for precisely growing structurally robust films and coatings containing germanium and various fluoride compounds for use as an optical filter. The process comprises depositing two (2) materials having different indices of refraction via molecular beam epitaxy at a temperature significantly lower than the optimal growth temperature. At such lower temperature, layers of the respective compounds are grown, via molecular beam epitaxy, such that the layers contain large concentrations of dislocations. Once the film or coating has been grown to the desired thickness, the material deposited is allowed to cool to room temperature and may then be used in a wide range of applications.

15 Claims, 1 Drawing Sheet

PROCESS FOR FABRICATING STRUCTURALLY ROBUST OPTICAL COATINGS

FIELD OF THE INVENTION

The present invention relates to methods for manufacturing, by molecular beam epitaxy, structurally robust multi-layer structures consisting of germanium and a fluoride-containing compound for use as optical coatings in high performance optical filters.

BACKGROUND OF THE INVENTION

The use of molecular beam epitaxy (MBE) for growing materials upon substrates is well-known in the art. In this regard, MBE is ideal for controllably growing films or coatings of material to precise degrees of thickness. Such process is especially well suited to make semi-conductor devices. Exemplary of such applications include the teachings of U.S. Pat. Nos. 5,356,831 and 5,164,831 and 5,164,359 to Calvillo, et al., U.S. Pat. No. 5,141,894 to Bisaro, et al. and U.S. Pat. No. 5,100,832 to Kitagawa, et al., all of which are incorporated herein by reference.

MBE is further useful in growing multi-layer coatings for use as high-performance optical filters. In such applications, two compounds having different indices of refraction are grown in alternating layers, upon commonly used substrates such as silicone (Si) or gallium arsenide (GaAs). Typically, such alternating layers are comprised of germanium (Ga), on one hand, and a fluoride-containing compound, such as strontium fluoride ($SrF_2$), calcium fluoride ($CaF_2$), or lithium fluoride ($LiF_2$), on the other. The fabrication of optical coatings formed of multiple layers of germanium and fluoride-containing compounds is ideal insofar as each compound has an index of refraction substantially different than the other. For example, germanium has an index of refraction of approximately four (4) and strontium fluoride has index refraction of approximately 1.44.

Notwithstanding their desirability, fabrication of such optical coatings is problematic. Typically, such coatings must be grown in stacks of alternating germanium layers and fluoride-containing layers to precise thicknesses usually in the range of 1 to 2 μm. While MBE can satisfy the rigorous thickness control requirements, such MBE grown films have the drawback of cracking when cooled to room temperature from the temperature the films are deposited upon the substrate. In this respect, MBE grown films containing epitaxial germanium layers and epitaxial fluoride-containing layers are generally deposited upon substrates at temperatures of approximately 600° C. or higher. Cracking occurs during the cooling period following deposition upon the substrate due to there being a large difference in thermal expansion co-efficients between germanium and the fluoride-containing compound. For example, germanium as a thermal expansion co-efficient of $6.1 \times 10^{-6}/°C$. and strontium fluoride has a thermal expansion co-efficient of $18 \times 10^{-6}/°C$.

Before any MBE grown germanium/fluoride multi-layer structures can be utilized as optical filters, such structures must be essentially free from cracks. To the extent even minor cracks exist, such cracks may further cause these multi-layer coatings to become structurally incompetent when subjected to extremes in temperature, such as from 77° K. to room temperature, as will typically be encountered by such optical coatings when utilized in conventional military and commercial applications.

As such, there is a need in the art for a process for depositing an optical coating containing germanium and a fluoride-containing compound that is structurally more robust than coatings applied by prior art methods.

There is additionally a need in the art for a novel MBE deposition process that enables MBE grown germanium/fluoride structures to be deposited upon a substrate and thereafter cooled to room temperature without the formation of any cracks being formed therein.

There is still further need in the art a novel deposition process that enables a germanium/fluoride-containing film to be applied to a given substrate that is structurally stable when exposed to extreme ranges of temperatures.

SUMMARY OF THE INVENTION

The present invention specifically addresses and alleviates the above-deficiencies in the art. More specifically, the present invention is directed to a novel MBE deposition process that enables films comprised of germanium and a fluoride-containing compound to be deposited on a substrate in a manner that eliminates cracking of such material when the same is cooled from its MBE deposition temperature to room temperature.

The process essentially comprises the steps of depositing two (2) compounds having a very different index or refraction, namely germanium and a fluoride-containing compound such as strontium fluoride, via MBE at sub-optimal growth temperatures. Such films are grown via MBE such that the film growth intentionally contains a large concentration of defects, known as dislocations, in the crystal lattice.

By continuously growing germanium/fluoride-containing films or coatings at sub-optimal temperatures, the number of dislocations introduced into the lattice becomes present in large numbers and greater density. The presence of such dislocations has the net effect of relieving stress on the multiple layers of germanium/fluoride-containing compound deposited on the substrate. Specifically, such stress is relieved as a result of the large difference in the respective thermal expansion co-efficients of germanium, on one hand, and the fluoride-containing compound, on the other.

Once the film/coating has been grown to the desired thickness, the MBE deposition process is discontinued and the resultant film/coating is then allowed to cool to room temperature. The resultant film/coating will have the desired properties to be utilized as an optical filter. Importantly, the film/coating will be structurally robust and essentially free from cracks as is typically found in epitaxially grown germanium/fluoride-containing films and coatings of the prior art. Likewise, the resultant film/coating deposited by the method of the present invention is thermally stable and can withstand repeated exposures to extreme ranges of temperature without cracking, unlike most epitaxially grown germanium/fluoride-containing compounds of the prior art.

It is therefore an object of the present invention to provide a novel MBE deposition process that allows at least two (2) compounds having very different indices of refraction to be deposited on a substrate and later used as an optical filter that is resistant to cracking when cooled from its MBE deposition temperature.

Another object of the present invention is to provide a novel MBE deposition process that allows two (2) compounds having different thermal expansion co-efficients to be deposited on a substrate such that the deposited compounds are resistant to cracking when exposed to extreme temperatures.

Another object of the present invention is to disclose a novel MBE deposition process wherein two (2) compounds, namely germanium and a fluoride-containing compound, are applied to a substrate without significant cracking occurring thereafter such that said deposited material may be utilized as an optical filter.

DETAILED DESCRIPTION OF THE PREFERRED EMBODIMENT

Figure 1:
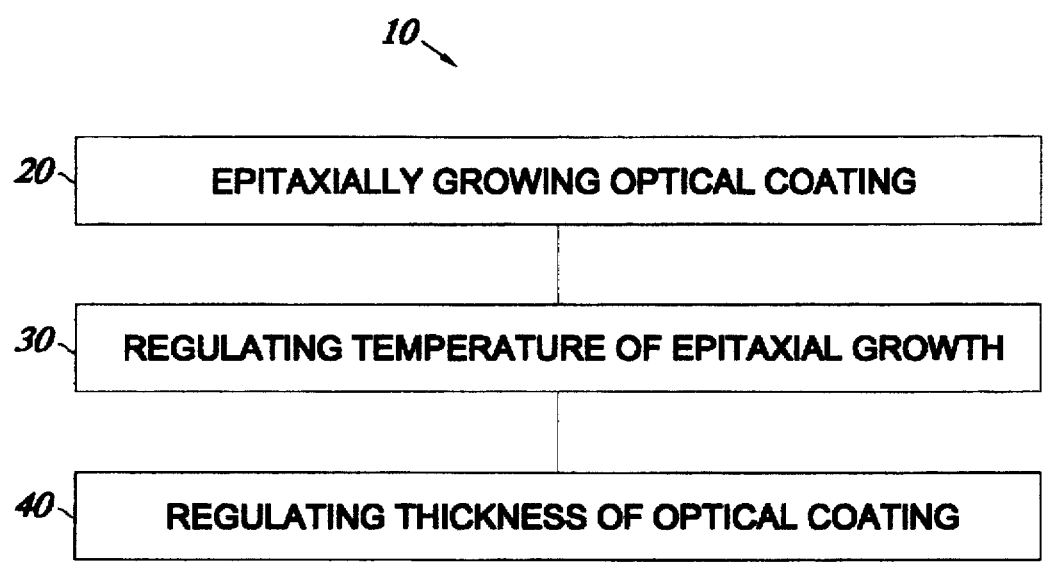
FIG. 1 is a schematic diagram of the steps comprising the process of the present invention.

The present invention comprises a novel molecular beam epitaxy (MBE) deposition process useful in growing a structurally robust films or coatings for use as high performance optical filters upon a substrate. More particularly, the novel MBE deposition process described herein is useful in growing structures comprised of compounds having very different indices of refraction.

The use of MBE for purposes of growing films and coatings on substrates is well-known in the art. For example, use of MBE for growing films and coatings on substrates is described in detail in U.S. Pat. Nos. 5,387,459 to Hung; 5,356,831 to Calviello, et al.; 5,141,894 to Bisaro, et al.; and 5,100,832 to Kitagowa, et al., the teachings of which are expressly incorporated herein by reference.

The use of MBE to fabricate optical coatings upon substrates is likewise well-known to those skilled in the art. Preferably, such optical films/coatings are made from multiple alternating layers of two (2) materials having different indices of refraction. Among those materials ideal for fabricating such optical coatings are the combination of germanium (Ge) with a fluoride-containing compound, such as strontium fluoride ($SrF_2$), calcium fluoride ($CaF_2$) or lithium fluoride ($LiF_2$). Particularly well suited for fabricating such coatings is the combination of germanium, which has an index of refraction of around four (4), and strontium fluoride, which has an index refraction of around 1.44.

MBE is ideal for fabricating such coatings and films insofar as MBE precisely controls the thickness of such film or coating as applied to a substrate. As is known, such precise thickness is necessary for use of such films and coatings as optical filters. In this regard, such optical coatings are typically formed as a stack having 6 to 10 alternating layers of germanium and strontium fluoride with each layer having a thickness ranging from 0.1 µm to 0.5 µm. The typical overall thickness of such coatings are in the range of 1 to 2 µm. Results of MBE grown germanium/strontium fluoride multi-layer structures actually indicate that such structures (i.e., films or coatings) can be grown with angstrom scale precision.

Notwithstanding the ideal properties of germanium when combined with a fluoride-containing compound for use as optical coatings and further, that MBE provides for precise control of the thickness of such fabricated coatings, significant drawbacks exist with such MBE grown films. MBE grown multi-layer films have a tendency to crack when lowered from their optimal growth temperature, which is typically at or above 600° C., to room temperature (i.e., approximately 30° C.). Such cracking occurs due to the large difference in the respective thermal expansion co-efficients between germanium and the fluoride compound combined therewith. In this respect, germanium has a thermal expansion co-efficient of approximately $6.1\times10^{-6}$/°C. and strontium fluoride, for example, has a thermal expansion co-efficient of $18\times10^{-6}$/°C. As such, when multiple layers of germanium/strontium fluoride are applied to a given substrate, significant cracking occurs between the respective layers, thus causing cracks to form therethroughout. As is known to those skilled in the art, the existence of crack prevents such MBE grown multi-layer structures from being utilized as optical filters.

The present invention solves the aforementioned cracking problem by providing a novel MBE deposition process which fabricates structurally robust optical coatings resistant to cracking. Furthermore, the MBE deposition process of the present invention may be utilized on most substrates commonly used in MBE, including but not limited to, silicone and gallium arsenide.

The present invention 10 comprises the step of growing such optical coatings upon a substrate 20, via MBE, at a regulated temperature significantly lower than the optimal growth temperature utilized in conventional MBE deposition processes 30. In this regard, such optical coatings are preferably grown via MBE at temperatures of 400° C. or lower.

By growing such optical coatings below the optimal growth temperature, there is thus introduced a large concentration of structural defects or dislocations within the coating as it is being grown in the substrate. As will be recognized by those skilled in the art, the density of dislocations that form within the optical coating increases as the MBE growth temperature is decreased from the optimal growth temperature of approximately 600° C. The presence of such structural defects or dislocations effectively relieves stresses between the multiple layers of the coating as the same are being deposited upon the substrate due to the difference in the respective thermal expansion coefficients of the components comprising the coating. In this respect, strontium fluoride, for example, when grown at 550° C. shown increased dislocation density, which increases with the corresponding decrease in the MBE deposition temperature.

At present, it is believed that 400° C. is ideal insofar as such temperature promotes the formation of a sufficient concentration of dislocations within the optical coating such that the same is resistant to cracking when cooled at such temperature to approximately 30° C. Forming such coatings at approximately 400° C. is further advantageous insofar as the thickness of the film/coating may be selectively controlled with an in situ thickness monitoring technique, such as reflection high energy electron diffraction (i.e., RHEED).

Notwithstanding, it should be understood that other suboptimal MBE growth temperatures may be utilized to form sufficient dislocation densities to relieve stress within the coating when the same is cooled to room temperature. In this regard, the ideal dislocation density would be the minimal value that is necessary to relieve stress within the structure as it is cooled.

The coating is grown to the desired thickness 40 as per conventional MBE deposition processes. Thereafter, the coating applied to the substrate will cool from its deposition temperature to room temperature without cracking. In addition to being grown essentially crack-free, the resultant coating is further thermally resistant when exposed to extremes in temperature. In this regard, optical coatings of germanium and strontium fluoride deposited by the MBE process of the present invention have been found to withstand repeated exposure to temperatures ranging from 77° K. to room temperature. As such, the present invention is ideally suited for manufacturing optical coatings that must necessarily be structurally robust and capable of withstanding such extremes in temperatures, as may be encountered in typical military and commercial applications.

There has thus been provided a novel MBE process for depositing a structurally robust optical coating on a substrate resistant to cracking when cooled following deposition of the coating thereon. Additional modifications and improvements of the present may also be apparent to those skilled in the art. Thus, the particular processes described and illustrated herein are not intended to serve as limitations of alternative processes within the spirit and scope of the invention.

What is claimed is:

1. A process for forming a structurally robust optical coating upon a substrate comprising the steps of:
   (a) epitaxially growing first and second compounds upon said substrate such that a resultant coating is formed thereon, said first compound having a first index of refraction and said second compound having a second index of refraction, said first index of refraction being different from said second index of refraction; and
   (b) promoting the formation of dislocations within said resultant coating such that the density of dislocations formed therein causes said coating to substantially withstand cracking when cooled from said temperature at which said first and second compounds are epitaxially grown upon said substrate.

2. The process of claim 1 wherein said first compound has a first index of refraction less than two (2) and said second compound has a second index of refraction greater than two (2).

3. The process of claim 1 wherein in step (a), said first and second compounds are grown by molecular beam epitaxy.

4. The process of claim 1 wherein said first compound comprises germanium and said second compound is selected from the group consisting of strontium fluoride, calcium fluoride and lithium fluoride.

5. The process of claim 1 wherein in step (b), said temperature is regulated to be lower than 600° C.

6. The process of claim 1 further comprising the step of:
   (d) regulating the thickness of said optical coating to be between 1 and 2 µm.

7. A process for depositing an optical coating upon a substrate comprising the steps of:
   (a) epitaxially growing first and second compounds upon said substrate such that a resultant coating is formed thereon, said first compound having a first thermal expansion co-efficient and said second compound having a second thermal expansion co-efficients, said first thermal expansion co-efficient being different from said second thermal expansion co-efficient; and
   (b) promoting the formation of dislocations within said resultant coating such that the density of dislocations formed therein causes said coating to substantially withstand cracking when cooled from said temperature at which said first and second compounds are epitaxially grown upon said substrate.

8. The process of claim 7 wherein in step (a), said first and second compounds are grown by molecular beam epitaxy.

9. The process of claim 7 wherein said first compound comprises germanium and said second compound is selected from the group comprising strontium fluoride, calcium fluoride, or lithium fluoride.

10. The process of claim 7 further comprising the step of regulating the thickness of said optical coating to be between 1 and 2 µm.

11. A process for depositing an optical coating comprised of germanium and strontium fluoride upon a substrate comprising the steps:
   (a) epitaxially growing a layer of germanium and strontium fluoride upon said substrate; and
   (b) regulating the temperature at which said layer of germanium and strontium fluoride is grown such that there is caused to form a multiplicity of dislocations within said layer such that the density of said locations formed therein prevents said layer of germanium and strontium fluoride to withstand cracking when cooled from said temperature which said layer of germanium and strontium fluoride are epitaxially grown.

12. The process of claim 7 wherein in step (b), said temperature is regulated to be approximately 400° C.

13. The process of claim 7 further comprising the step of regulating the thickness of said optical coating of germanium and strontium fluoride to be between 1 and 2 µm.

14. The process of claim 1 wherein in step (b) said step of promoting the formation of said dislocations within said resultant coating comprises regulating the temperature at which said first and second compounds are epitaxially grown.

15. The process of claim 7 wherein in step (b), said step of promoting the formation of dislocations within said resultant coating comprises regulating the temperature at which said first and second compounds are epitaxially grown.

* * * * *